United States Patent
Srinivasan

(10) Patent No.: US 7,237,058 B2
(45) Date of Patent: Jun. 26, 2007

(54) INPUT DATA SELECTION FOR CONTENT ADDRESSABLE MEMORY

(75) Inventor: Varadarajan Srinivasan, Los Altos, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/047,754

(22) Filed: Jan. 14, 2002

(65) Prior Publication Data

US 2003/0135691 A1    Jul. 17, 2003

(51) Int. Cl.
*G06F 12/00*    (2006.01)
(52) U.S. Cl. .......................... 711/108; 365/49; 370/392
(58) Field of Classification Search ................. 365/49; 370/392; 711/108
See application file for complete search history.

(56) References Cited

U.S. PATENT DOCUMENTS

| | | | |
|---|---|---|---|
| 3,648,254 A | 3/1972 | Beausoleil | |
| 4,845,668 A | 7/1989 | Sano et al. | |
| 4,958,377 A | 9/1990 | Takahashi | |
| 4,996,666 A | 2/1991 | Duluk, Jr. | |
| 5,046,046 A | 9/1991 | Sweha et al. | |
| 5,088,066 A | 2/1992 | Castro | |
| 5,319,589 A | 6/1994 | Yamagata et al. | |
| 5,319,762 A | 6/1994 | Mayer | |
| 5,414,704 A | 5/1995 | Spinney | |
| 5,438,535 A | 8/1995 | Lattibeaudiere | |
| 5,444,649 A | 8/1995 | Nemirovsky | |
| 5,619,713 A * | 4/1997 | Baum et al. ................. 707/102 |
| 5,642,322 A | 6/1997 | Yoneda | |
| 5,809,330 A * | 9/1998 | Ninomiya ....................... 710/9 |
| 5,860,085 A | 1/1999 | Stormon et al. | |
| 5,870,324 A | 2/1999 | Helwig et al. | |
| 5,890,005 A * | 3/1999 | Lindholm ................... 713/320 |
| 5,920,886 A | 7/1999 | Feldmeier | |
| 5,956,336 A | 9/1999 | Loschke et al. | |
| 5,978,885 A | 11/1999 | Clark, II | |
| 6,041,389 A | 3/2000 | Rao | |
| 6,069,573 A | 5/2000 | Clark, II et al. | |
| 6,081,440 A | 6/2000 | Washburn et al. | |
| 6,081,442 A | 6/2000 | Igarashi et al. | |
| 6,098,147 A | 8/2000 | Mizuhara | |
| 6,161,144 A | 12/2000 | Michels et al. | |
| 6,169,685 B1 * | 1/2001 | Gandini et al. ............... 365/49 |
| 6,226,710 B1 | 5/2001 | Melchior | |
| 6,243,281 B1 | 6/2001 | Pereira | |

(Continued)

OTHER PUBLICATIONS

The American Heritage Dictionary of the English Language, Fourth Edition, Houghton Mifflin Company, 2000.*

(Continued)

*Primary Examiner*—Gary Portka
*Assistant Examiner*—Kaushik Patel
(74) *Attorney, Agent, or Firm*—Shemwell Mahamedi LLP

(57) ABSTRACT

A method and apparatus for input data selection for content addressable memory. In one embodiment, the apparatus includes an array of CAM cells, a select circuit adapted to generate a plurality of select signals each indicative of a segment of input data provided to the CAM apparatus, and switch circuitry including a plurality of programmable switch circuits each programmable to output a respective bit of the input data as a comparand bit for the array of CAM cells in response to one of the select signals.

23 Claims, 17 Drawing Sheets

U.S. PATENT DOCUMENTS

| | | | |
|---|---|---|---|
| 6,275,406 B1 | 8/2001 | Gibson et al. | |
| 6,289,414 B1 | 9/2001 | Feldmeier | |
| 6,324,087 B1 | 11/2001 | Pereira | |
| 6,351,142 B1 | 2/2002 | Abbott | |
| 6,353,873 B1 | 3/2002 | Melchior | |
| 6,373,758 B1 | 4/2002 | Hughes et al. | |
| 6,374,326 B1* | 4/2002 | Kansal et al. | 711/108 |
| 6,424,659 B2 | 7/2002 | Viswanadham et al. | |
| 6,445,628 B1 | 9/2002 | Pereira et al. | |
| 6,525,987 B2 | 2/2003 | Hilbert | |
| 6,597,595 B1 | 7/2003 | Ichiriu et al. | |
| 6,629,099 B2 | 9/2003 | Cheng | |
| 6,671,771 B2* | 12/2003 | Perloff | 711/108 |
| 6,691,252 B2 | 2/2004 | Hughes et al. | |
| 2001/0048625 A1* | 12/2001 | Patti et al. | 365/201 |
| 2002/0007446 A1 | 1/2002 | Stark | |
| 2002/0015348 A1 | 2/2002 | Gillingham | |
| 2002/0073073 A1 | 6/2002 | Cheng | |
| 2002/0126672 A1* | 9/2002 | Chow et al. | 370/392 |
| 2003/0005146 A1 | 1/2003 | Miller et al. | |
| 2003/0039135 A1 | 2/2003 | Srinivasan et al. | |
| 2003/0084236 A1* | 5/2003 | Khanna et al. | 711/108 |
| 2003/0131331 A1* | 7/2003 | Reblewski et al. | 716/10 |
| 2004/0032775 A1 | 2/2004 | Srinivasan | |

OTHER PUBLICATIONS

Steven A. Guccione et al, "A Reconfigurable Content Addressable Memory," IPDPS 2000 Workshops, LNCS 1800, Springer-Verlag, 2000, pp. 882-889.*

PCT Search Report, International Application No. PCT/US02/28826, filed Sep. 10, 2002.

* cited by examiner

INPUT DATA SELECTION FOR CONTENT ADDRESSABLE MEMORY

FIELD OF THE INVENTION

This invention relates generally to the field of memory devices. More specifically, the invention relates to content addressable memory devices.

BACKGROUND OF THE INVENTION

Networks contain a collection of computing systems (e.g., clients and servers) that are interconnected by transmission lines to enable the transfer of data between them. A network typically includes multiple access points (e.g., routers and servers) that may switch and/or route data between transmission lines to transfer data from a source to a destination. Data is typically transmitted in the form of packets that are made up of smaller data cells. A packet is a unit of data that is routed between a source and a destination on a packet-switched network. When a file (e.g., e-mail, graphics, etc.) is sent from one place to another on a network, the file is divided into such smaller packets making them more efficient for transmission. The individual packets for a given file may travel different routes throughout networks with each packet containing both data and transmission information associated with the routing of data. As such, a packet may be described as having a payload containing the data, and one or more headers that contain the routing information (e.g., a destination address).

When all the packets have arrived at a destination, they are reassembled into the original file at the receiving end. Such a packet switching scheme is an efficient way to handle transmission on a connectionless network. This is in contrast to a circuit switching scheme where a connection (e.g., a voice connection) requires the dedication of a particular path for the duration of the connection.

A router is a device (e.g., hardware, firmware, software) that determines the next network segment to which a packet should be forwarded towards its destination. A router may be positioned at points within a network or where one network meets another, referred to as a gateway. A router may create and maintain tables of the available routes and their conditions for use with other information to determine the best route for a given packet. Typically, a packet may travel through a number of network points having routers before arriving at its destination.

When a data packet arrives at the input of a router, several lookups may be performed to determine the subsequent handling of the packet, as illustrated in FIG. 1. The lookups may include, for examples, where to send the packet next (Next Hop), the quality of service requirement (QoS), the Ethernet port address, etc. Consider, for example, a packet arriving at Router-A. Router-A needs to determine whether the packet is destined for local servers connected directly to Router-A, or if the packet should go to the next router on a route (Router-B) to a destination. Additionally, Router-A may assign a priority based on the destination address (DA) and the source address (SA) of the packet.

The packet header may first be parsed or processed to get the values from different fields (e.g., SA, DA, protocol type, QoS, etc) in order to perform the various lookups. A packet classification lookup, for example, may be performed using SA, DA and other relevant fields in the packet header. The Next Hop lookup, for example, may also be performed to determine whether the packet is meant for local servers or for Router-B. If the packet is destined for Router-B, the packet is then put in a queue for Router-B. If the packet is destined for a local server (e.g., Server-1 or Server-2), then a media access control (MAC) lookup is performed to send the packet to the appropriate server. In the preceding example, three lookups are necessary for sending the packet on its way: Packet Classification, Next Hop, and MAC. However, often there are other lookups performed on the packet header, with the number of lookups exceeding five or more.

Routers may use processors and content addressable memory (CAM) devices to perform the various lookups on packets. The CAM device can be instructed by a processor to compare a search key, also referred to as comparand data (e.g., packet header data), with data stored in its associative memory array, as illustrated in FIG. 2. The CAM simultaneously examines all of its entries and selects the stored data that matches the key.

When the entire CAM device, or blocks thereof, is searched simultaneously for a match of the stored data with the key comparand data, the CAM device indicates the existence of a match by asserting a match flag. Multiple matches may also be indicated by asserting a multiple match flag. The CAM device typically includes a priority encoder to translate the matched location into a match address or CAM index and outputs this address to a status register so that the matched data may be accessed. The priority encoder may also sort out which matching memory location has the top priority if there is more than one matching entry.

Data may be represented in the form of strings of binary digits ("bits") having a low ("0") logic state and a high ("1") logic state. Different types of CAMs may be used with different data formats. A binary CAM is designed to operate with "0" and "1" states, while a ternary CAM is designed to operate with "0", "1", and "don't care" states. The bits may be organized into groups such as a word (e.g., 64 or 72 bits wide) and stored in different segments of a CAM. The keys used for different data fields may have different word sizes, for example, the key for a Classification lookup may be 128 bits wide and the key for a Next Hop lookup may be 32 bits wide.

A router may include multiple CAMs, with each CAM having a different table or, alternatively, a single CAM having multiple blocks for each of the different tables, for performing the different lookups. For example, a router may include a 32 bit wide Next Hop CAM, a 128 bit Classification CAM, and a 48 bit MAC CAM. With routers having multiple CAMs, each of the multiple CAMs are typically connected to common buses that are used to communicate the various keys and other input and output data with each of the CAM devices. Similarly, with routers having a single CAM with multiple blocks, each of the blocks is accessed using common buses. Thus, lookups are typically performed sequentially before a packet is processed (e.g., routed to the next destination or classified). Because the buses are shared with so many input and output functions of all the CAMs or CAM blocks, many clock cycles are required to multiplex data on the bus. This generally limits the search rate and overall throughput of conventional CAM devices. As the number of ports, segments, or devices that are supported by routers and as the number of lookups increase, conventional CAM devices and architectures can undesirably limit the system's overall throughput.

BRIEF DESCRIPTION OF THE DRAWINGS

The present invention is illustrated by way of example and not intended to be limited by the figures of the accompanying drawings.

DETAILED DESCRIPTION

Figure 1:
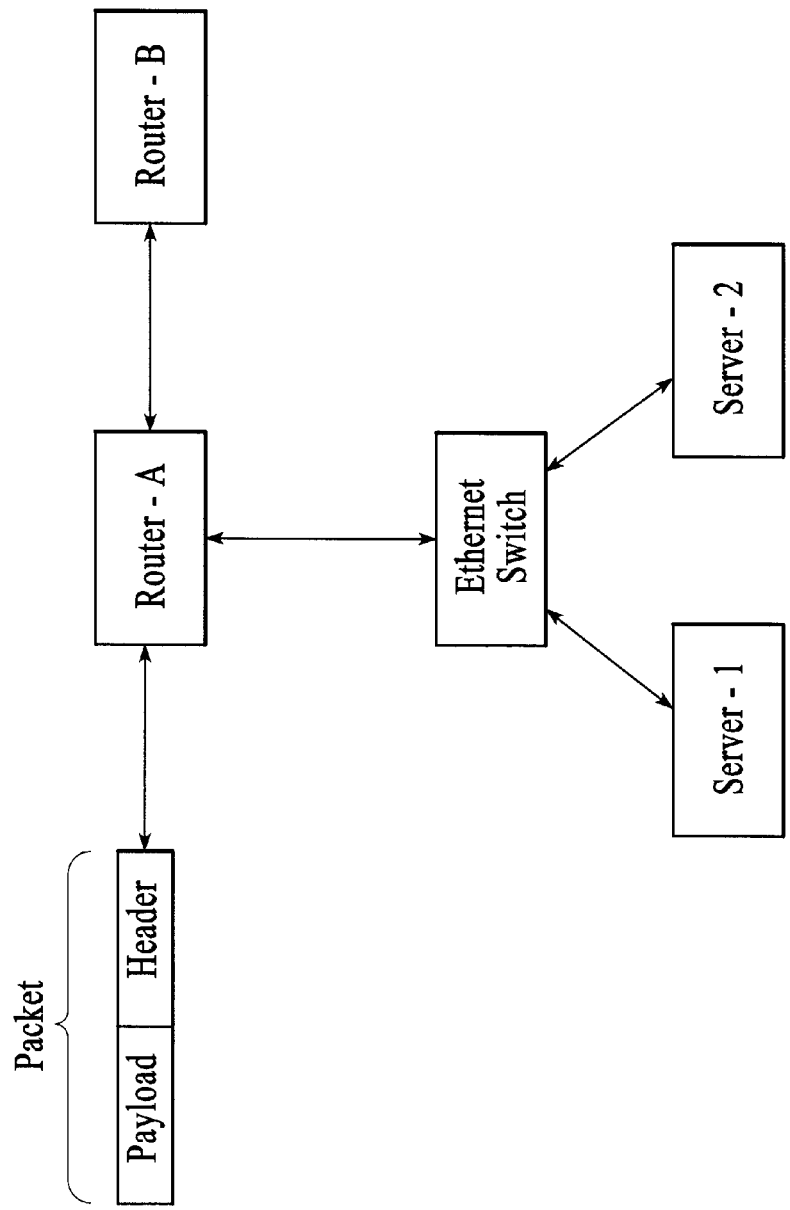
FIG. 1 illustrates an example of packet handling by a router.
Figure 2:
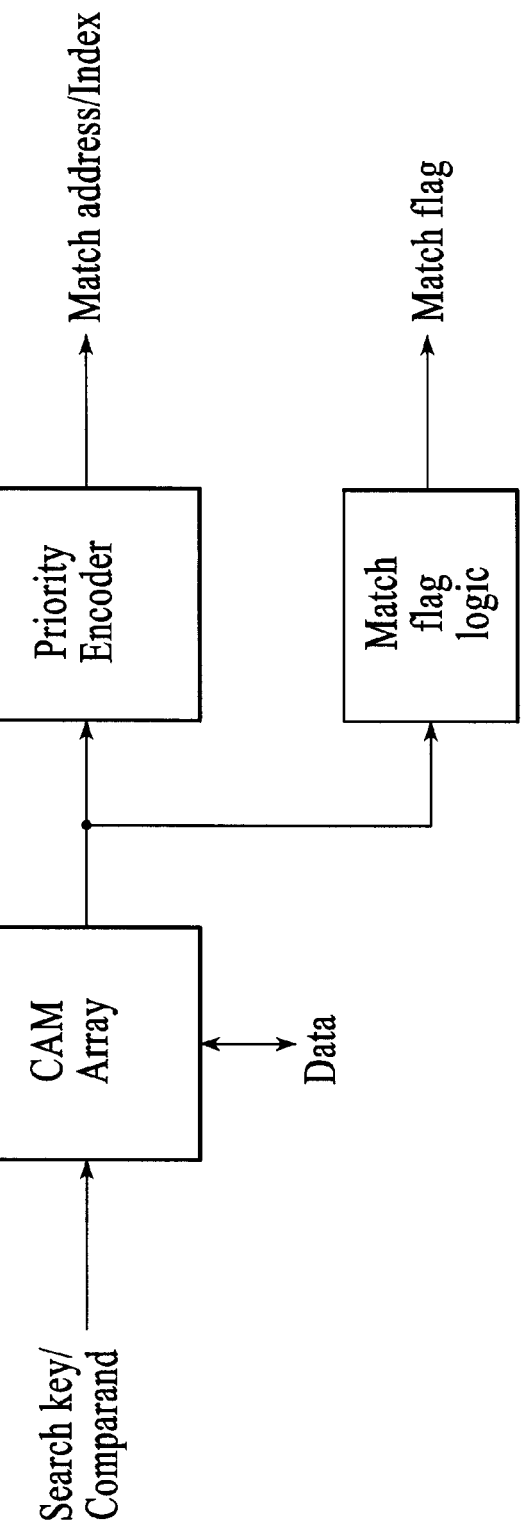
FIG. 2 illustrates one embodiment of a conventional CAM device.

In the following description, numerous specific details are set forth such as examples of specific, components, circuits, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Embodiments of the present invention include various method steps, which will be described below. The steps may be performed by hardware components or may be embodied in machine-executable instructions, which may be used to cause hardware components (e.g., a processor, programming circuit) programmed with the instructions to perform the steps. Alternatively, the steps may be performed by a combination of hardware and software.

Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

The machine readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

The methods and apparatus described herein may be used to translate input data (e.g., an input string) to one or more comparands for searching in a content addressable memory. In one embodiment, an apparatus includes one or more filter circuit that filter (e.g., compacts, duplicates and/or transposes) the input data, according to the needs of the user. The filter circuit includes a switch circuit (e.g., a cross-bar switch, switch matrix, switch fabric, etc.) and select logic. The select logic selects or enables particular programmed switch paths of the switch circuit to provide one or more bits or groups of bits from the input data to particular positions in the comparand string. For one embodiment, the input data has a larger number of bits than the input data bus width of the CAM device such that the entire input data is loaded into the CAM device over the input data bus in several load operations (e.g., over several clock cycles). The select logic may select or enable particular programmed switch paths of the switch circuit in each of the different load operations. The CAM array may also be segmented into several segments of CAM cells with each segment having a corresponding filter circuit.

Figure 3:
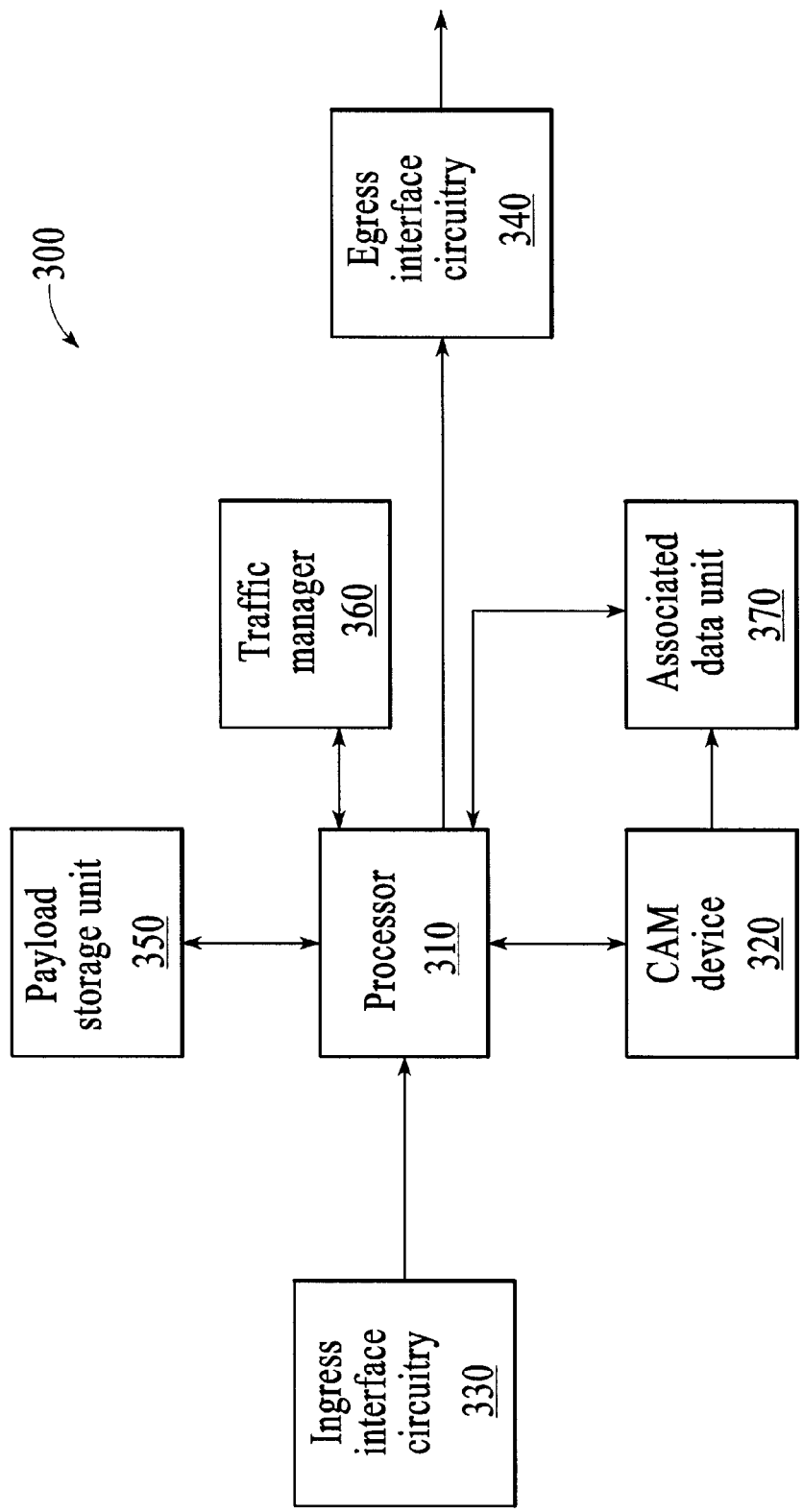
FIG. 3 illustrates one embodiment of a line card or blade of a router having a CAM device configured according to one embodiment of the present invention.

FIG. 3 illustrates one embodiment of a line card or blade of a router having a CAM device. Line card 300 includes processor 310, ingress interface circuitry 330, egress interface circuitry 340, CAM device 320, associated data storage unit 370, traffic manager 360, and payload storage unit 350.

Processor 310 functions to control the overall operation of line card 300 in cooperation with the other components of line card 300. For example, processor 310 receives packets from a network medium through ingress interface circuitry 330, stores the payload of packets in payload storage unit 350, and processes packet header information to determine required lookups in CAM device 320 and subsequent handling of the packets, as discussed herein. Ingress circuitry includes, for example, PHY and MAC devices. Processor 310 sends out packets on a network medium through egress interface circuitry 340 based on the lookups performed by CAM device 320. Egress interface circuitry 340 may be connected to a switch fabric or directly to one or more other routers or switches. Processor 310 may be one or more network processor units (NPUs), microprocessors, or one or more special purpose processors such as a digital signal processor (DSP). In another embodiment, processor 310 may be another type of controller, for example, a field programmable gate array or a general purpose processor. The processor 310, ingress interface circuitry 330, and egress interface circuitry 340 components of a router are known in the art; accordingly, a detailed discussion is not provided.

In response to information in a packet header, for a particular packet, processor 310 determines the number and types of lookups to be performed by one or more of CAM devices 320, and forms the search keys for these lookups. The searches or lookups may include, for example, classification lookups, forwarding lookups (e.g., Next Hop or longest prefix match (LPM) lookup, MAC lookup, MPLS lookup, etc.). When multiple searches are required, processor 310 forms a composite search key that includes at least two, and as many as all, of the various search keys for the lookups. The composite search key is provided as a common input string to CAM device 320. CAM device 320 selectively identifies and extracts the individual search keys from the common input string and provides the individual search keys to the associated CAM blocks to perform the lookups. Advantageously, the lookups can then occur concurrently or simultaneously in the CAM blocks of CAM device 320, thereby increasing overall throughput over conventional systems in which searches are processed sequentially.

CAM device 320 may be a multiple block CAM device with each block capable of storing a different table for comparand lookups. Alternatively, CAM device 320 may represent multiple, single block CAM devices (e.g., with each single block CAM device formed on a different integrated circuit substrate) with each CAM device used to store a different table for comparand lookup. After one or more lookups are executed in CAM device 320, associated information for matching entries (e.g., additional routing information and/or packet information) may be retrieved from associated data unit 370. Processor 310 then communicates with traffic manager 360 to schedule the exit of a packet from line card 300 via egress interface circuitry 340.

Figure 4:
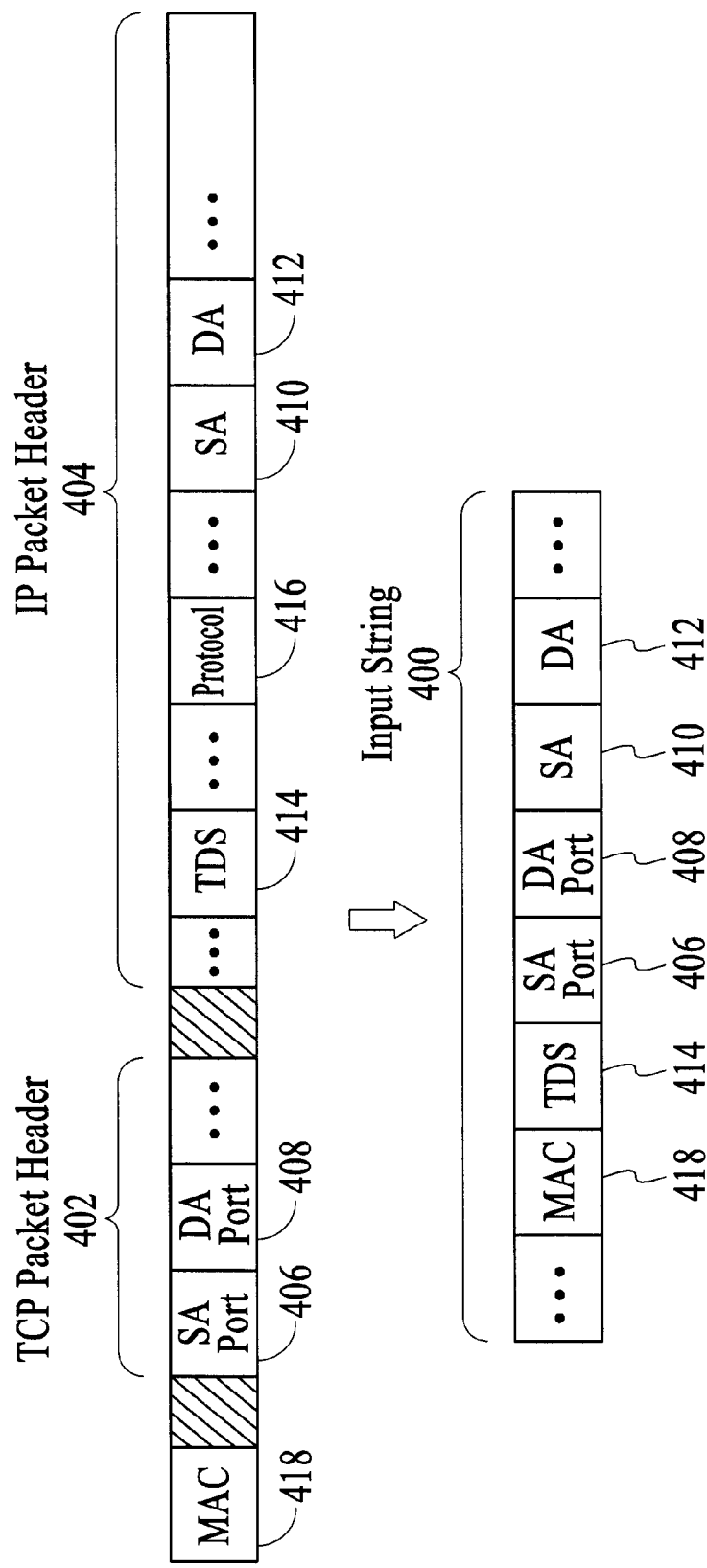
FIG. 4 illustrates one embodiment of a lookup string.

FIG. 4 illustrates one embodiment of an input string. Input string 400 includes field segments parsed or processed from one or more packet headers 402 and 404. When data processing systems (e.g., routers, clients, servers) exchange data over a network, the procedure involves the use of protocols by which these systems agree on how to communicate with each other. To reduce design complexity, networks may be organized as a series of layers. The number of layers and the function of each layer varies from network to network.

For example, where a transmission control protocol (TCP)/Internet protocol (IP) is used, it is organized into multiple layers including a network access layer and an Internet layer. The network access layer uses a TCP to enable the exchange of data between an end system and a network. An Internet layer uses an IP to enable data to transverse multiple interconnected networks. Each of these protocols use packet headers containing routing information, as discussed above. For example, TCP packet header 402 includes a source address (SA) port segment 406 and a destination address (DA) port segment 408, and IP packet header 404 includes a SA segment 410, a DA segment 412, a type of service (ToS) segment 414, and a protocol type segment 416.

In one embodiment, for example, processor 310 of FIG. 3 may be used to parse certain segments from packet headers 402 and 404 to generate input string 400 and transmit the input string to CAM device 320. For example, input string 400 may include MAC segment 418, TOS segment 414, SA port segment 406, DA port segment 408, SA segment 410, and DA segment 412. Alternatively, input string 400 may include more or less than the segments illustrated. A filter circuit (illustrated in FIG. 5) may then filter out the bit values of different field segments of input string 400 to generate different filtered comparand strings to concurrently perform different lookups in the CAM blocks. In an alternative embodiment, processor 310 may transmit as-received unparsed header segments to CAM device 320.

Figure 5:
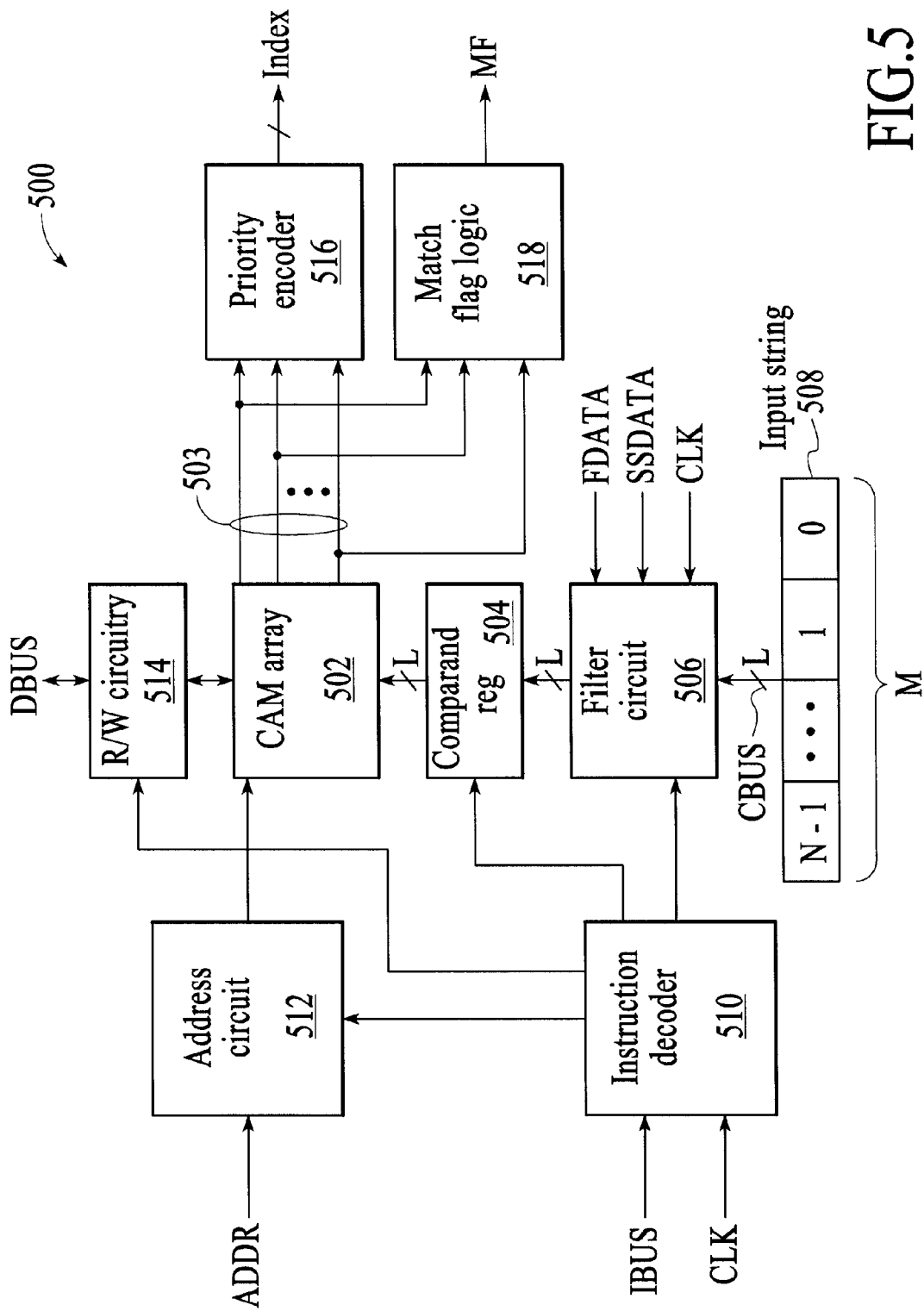
FIG. 5 illustrates one embodiment of a CAM device.

FIG. 5 illustrates CAM device 500 that is, for example, one embodiment of CAM device 320 of FIG. 3. CAM device 500 includes address circuit 512, instruction decoder 510, CAM array 502, read/write (R/W) circuitry 514, priority encoder 516, match flag logic 518, comparand register 504 and filter circuit 506.

CAM array 502 is an array of CAM cells that includes any number of rows of L bits of CAM cells that may be any types of CAM cells including, for example, binary and ternary CAM cells. Each CAM cell includes at least one memory storage element and at least one compare circuit. Other embodiments may be used to effectively implement an array of CAM cells.

CAM array 502 is coupled to comparand register 504 that receives input data from filter circuit 506 for lookup in CAM array 502. Comparand register 504 has an input bus width of L bits, and is coupled to filter circuit 506 that also has an input bus width of L bits. Comparand register 504 CAM device 500 receives input string 508 over comparand bus CBUS also having a width of L bits. The input string includes comparand data for comparison with data stored in one or more CAM cells of CAM array 502. Input string 508 may be generated, for example, by processor 310 of FIG. 300. Input string 508 may be, for example, input string 400 of FIG. 4. Note that, in an alternative embodiment, the number of bits in a row of CAM cells in CAM array 502 and/or the input bus width of comparand register 504 and/or the input bus width of filter circuit 506 may be different than L. The CAM device 500 may also include one or more global mask registers (not shown) for the comparand data provided to CAM array 502.

Input string 508 includes M bits, where M is greater than or equal to L. The input string is transferred over the CBUS in N segments, where N is at least M/L. If M is equal to L then all M bits of input string 508 are delivered in a single segment to filter circuit 506. If M is larger than L, for example, if M is 288 bits and L is 72 bits, then the 288 bits can be transferred over the CBUS in a minimum of four segments (4=288/72), with each segment having 72 bits of the input string. In another example, if M is 288 bits and L is 100 bits, then the 288 bits can be transferred over the CBUS in a minimum of three segments (2.88=288/100) with, for example, two segments having 100 bits and the last segment having 88 bits.

Alternatively, one or more of the N segments may have a different number of bits. For example if M is 288 bits and L is 100 bits, then 98 bits, for example, my be transferred over the CBUS in a first segment, 96 bits in a second segment and 94 bits in a third segment.

Filter circuit 506 receives filter data (FDATA), that is used to directly or indirectly program filter circuit 506 to generate a particular filtered comparand string from input string 508. For example, filter circuit 506 may be a cross-bar switch, switch matrix, or switch fabric that includes one or more programmable circuit elements (e.g., programmable memory storage elements) that can be programmed (e.g., in response to FDATA) to select one or more bits or groups of bits of the input string and provide them to comparand register 504. Filter circuit 506 can output the selected bit(s) to comparand register 504 in the same order as received over the CBUS, or in a different placement order (e.g., filtered out, translated, compacted, transposed, and/or duplicated).

Filter circuit 506 also receives segment select data (SS-DATA) that indicates which of the programmed circuit elements (i.e., programmed in response to FDATA) within filter circuit 506 will be selected at any given time to provide at least one bit from input string 508 to at least one bit position of comparand register 504. SSDATA is provided, for example, together with each segment of the input string during a compare operation. Filter circuit 506 also receives a clock signal CLK to time one or more operations of filter circuit 506. FDATA and SSDATA may be provided by, for example, by processor 310 of FIG. 3. In some instances, SSDATA indicates that none of the programmed circuit elements within filter circuits 506 are selected to output one or bits of the input string to the comparand register.

Instruction decoder 510 decodes various instructions provided on instruction bus IBUS (e.g., instructions to write or read data from CAM array 502 and to compare comparand data with one or more segments of the CAM array) and provides various control and/or timing signals to address circuit 512, filter circuit 506, R/W circuitry 514, and comparand register 504, to control when CAM device 500 performs an operation (e.g., a read, write or compare operation). Instruction decoder 516 may also provide various control and/or timing signals to CAM array 502, priority encoder 516 and match flag logic 518. The instructions are timed by CLK. In an alternate embodiment, instruction decoder 510 is omitted and various read, write and compare control signals are provided directly to one or more of the circuit blocks.

Data is written to CAM array 502 by read/write circuitry 514 and address logic 512. Address logic 512 selects one or more rows of CAM cells in response to an address provided over ADDR. The write data is provided to the selected cells (e.g., over one or more data bit lines) by the write portion of read/write circuitry 514 (e.g., write buffers). Data is read from one or more selected rows of CAM cells by the read portion of read/write circuitry 514 (e.g., by one or more sense amplifier circuits).

When CAM array 502 is searched for a match of the stored data with the key comparand data stored in comparand register 503, each matching location indicates a match on one of match lines 403. Match flag logic 518 indicates the existence of a match if at least one of the match lines 503 carries a match signal indicating a match. Additional flag logic such as almost full flag logic, full flag logic, and/or multiple match flag logic may also be included in CAM device 500.

Priority encoder logic 516 translates a matched location(s) into an index (or a match address) and outputs this index that may be used, for example, by processor 310 of FIG. 3 or to access associated data unit 370 of FIG. 3. Priority encoder logic 516 also identifies which matching location has the top priority if there is more than one matching entry.

Any of the signals provided over IBUS, DBUS, CBUS or ADDR may be time multiplexed with other signals and provided over one or more of the other buses.

Figure 6:
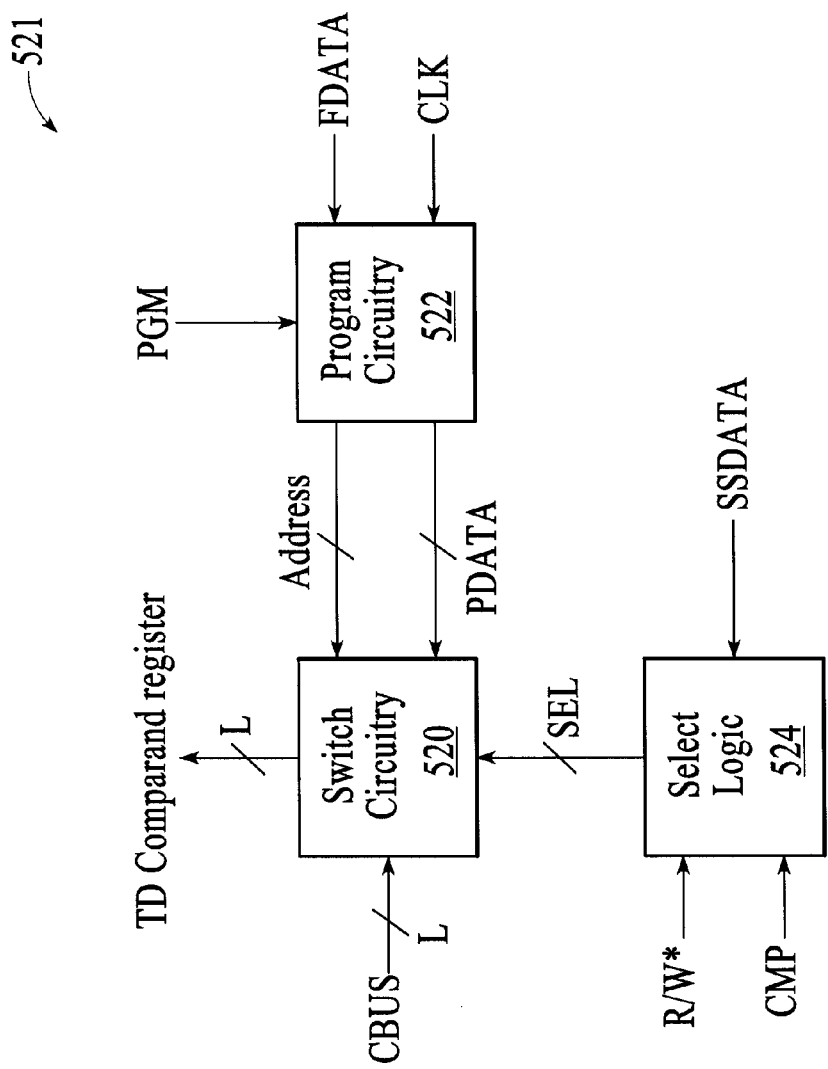
FIG. 6 illustrates one embodiment of the filter circuit of FIG. 5.

FIG. 6 illustrates filter circuit 521 that is one embodiment of filter circuit 506 of FIG. 5. Filter circuit 521 includes switch circuitry 520, program circuit 522 and select logic 524. Switch circuitry 520 includes a plurality of switch circuits, or paths (not shown), which are programmed by program circuit 522 to connect the input data bits with positions in comparand register 504. For example, switch circuitry 520 may be a crossbar switch, switch matrix, or switch fabric that includes one or more programmable circuit elements (e.g., programmable memory storage elements) that can be programmed by program circuit 522 (e.g., by PDATA) to select one or more bits or groups of bits of the input string and provide them to comparand register 504. Switch circuitry 520 can output the selected bit(s) to comparand register 504 in the same order as received over the CBUS, or in a different placement order (e.g., filtered out, translated, compacted, and/or duplicated).

Program circuit 522 programs switch circuitry 520 in response to FDATA, an address, and a program control signal PGM provided, for example, by instruction decoder 510 (or alternatively by processor 310 of FIG. 3, or any other component). PGM indicates when program circuit 522 is enabled to program switch circuitry 520. The address provided by program circuit 522 identifies one or more rows and/or columns of program switch circuits within switch circuitry 520 that will be programmed by PDATA. Several embodiments of the program circuit 522 is described in co-pending U.S. patent application Ser. No. 09/935,997, entitled "Concurrent Searching of Different Tables Within a Content Addressable Memory" filed on Aug. 22, 2001, which is incorporated herein by reference in its entirety.

In an alternate embodiment, program circuit 522 may be omitted and the address and PDATA provided directly to switch circuitry 520 from outside the CAM device incorporating filter circuit 521 (e.g., by processor 310 of FIG. 3).

Select logic 524 is configured to receive SSDATA that indicates which of the programmed circuit elements within switch circuitry 520 will be selected at any given time to provide at least one bit from input string 508 to at least one bit position of comparand register 504 (e.g., if the programming indicates such a connection). During a program operation, particular segments or groups of programmed switch circuits in switch circuitry 520 are programmed by SSDATA such that they are assigned segment identifiers as indicated by segment select signals SEL. SSDATA is programmed into select logic 524 when the program control signal R/W* is in a low logic state. SSDATA is read from select logic 524 when the program control signal R/W* is in a high logic state. During a compare operation, the control signal CMP is asserted to a high logic state and the SSDATA indicates which segment or groups of programmable switch elements are to be enabled. For another embodiment, CMP may be omitted and select logic 524 always enabled to compare.

If the SSDATA matches a programmed SSDATA for particular segment, the corresponding SEL signal is enabled to an active high logic state, while other SEL signals are disabled. In some instances, none of the SEL signals will be asserted if the programmed SSDATA does not match the input SSDATA. R/W* and CMP may be provided by instruction decoder 510 (e.g., in response to read, write or program, and compare instructions) or directly by another component (e.g., by processor 310 of FIG. 3). Alternatively, CMP and/or R/W* may be omitted.

For an alternative embodiment, SSDATA does not carry information for both the read/program function associated with R/W* and the compare function associated with CMP; rather, separate signal paths may be used for each function.

For another embodiment, SSDATA is provided directly to switch circuitry 520 without passing through select logic 524.

Figure 7:
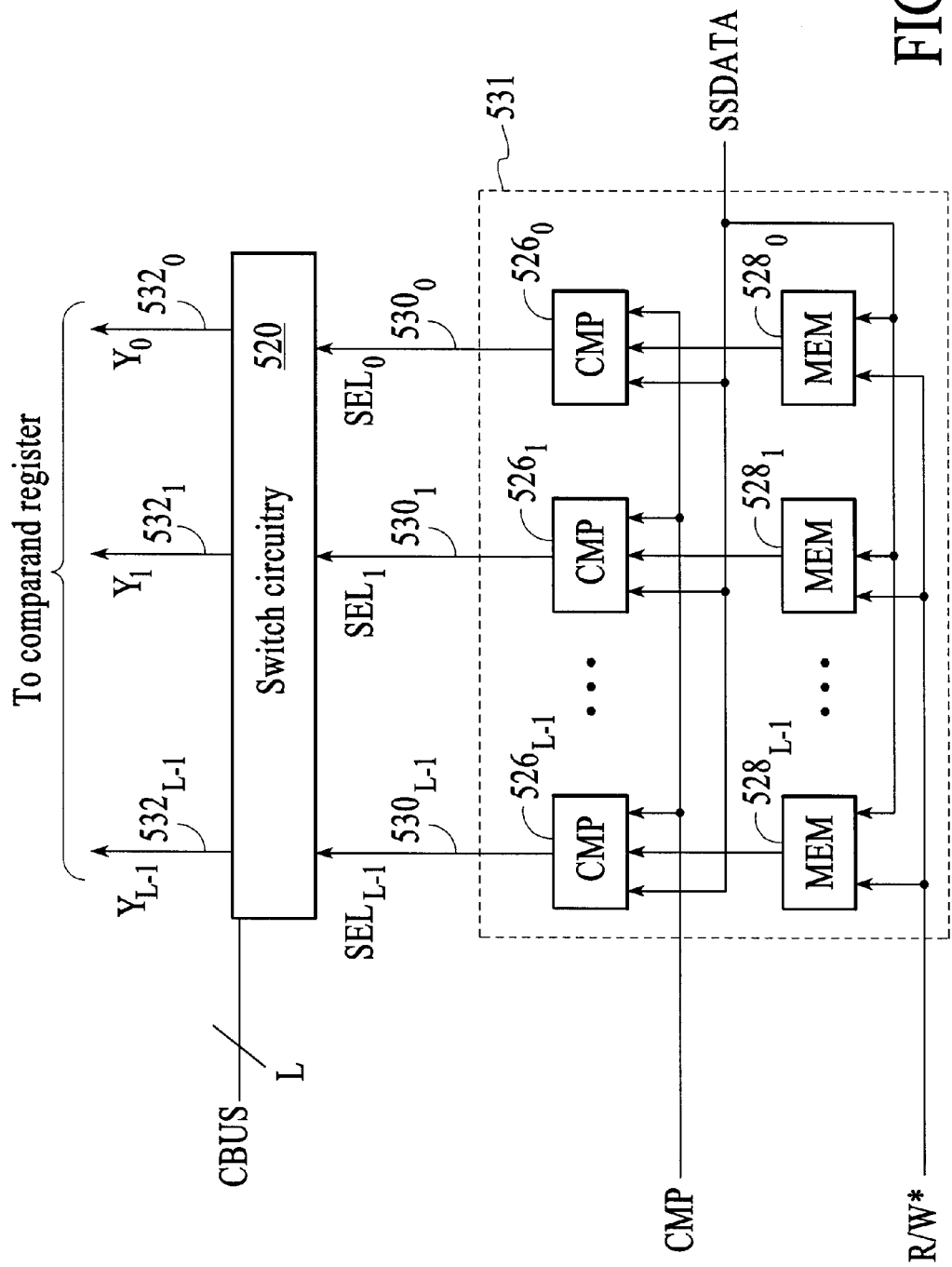
FIG. 7 illustrates one embodiment of the select logic of FIG. 6.

FIG. 7 illustrates select logic 531 that is one embodiment of select logic 524 of FIG. 6. Select logic 531 includes L compare circuits $526_0$–$526_{L-1}$, each coupled to a corresponding memory circuit $528_0$–$528_{L-1}$. The memory circuits each store one (or more) bits of SSDATA during a program or write operation (i.e., when R/W* is in a logic low state). Each of the compare circuits compares the contents of the corresponding memory circuit with SSDATA during a compare operation (i.e., when CMP is in a high logic state). The comparison results are reflected on the SEL signal lines $530_0$–$530_{L-1}$. The activated SEL signals select one or more of the programmed switch elements in the switch circuitry 520 to output one or more bits of the input string on the CBUS as outputs $Y_0$–$Y_{L-1}$ on signal lines $532_0$–$532_{L-1}$.

One or more of the memory circuits 528 can be programmed with the same segment information. For one example, a first group of memory circuits are programmed to select a first group of switch circuits in switch circuitry 520 and a second group of memory circuits of are programmed to a select a second group of switch elements in switch circuitry 520. In this example, during a compare operation, SSDATA represents the first group of select circuits during a first compare operation such that the first group of switch circuits is selected to couple one or bits from the CBUS to corresponding bit locations of the comparand register; and, SSDATA represents the second group of select circuits during a second compare operation such that the second group of switch circuits is selected to couple one or bits from the CBUS to corresponding bit locations of the comparand register.

Each memory circuit/compare circuit pair (e.g., memory circuit $528_0$ and compare circuit $526_0$) may be formed as a content addressable memory (CAM) cell. The CAM cell may be any type of CAM cell including be-binary (capable of storing and comparing two logic states) or ternary (capable of storing and comparing three states-logic 1, logic 0 and don't care). The SEL signal lines 530, in this example, represent match lines of the CAM cells. In an alternative embodiment, select logic 524 is a programmable decoder.

Figure 8:
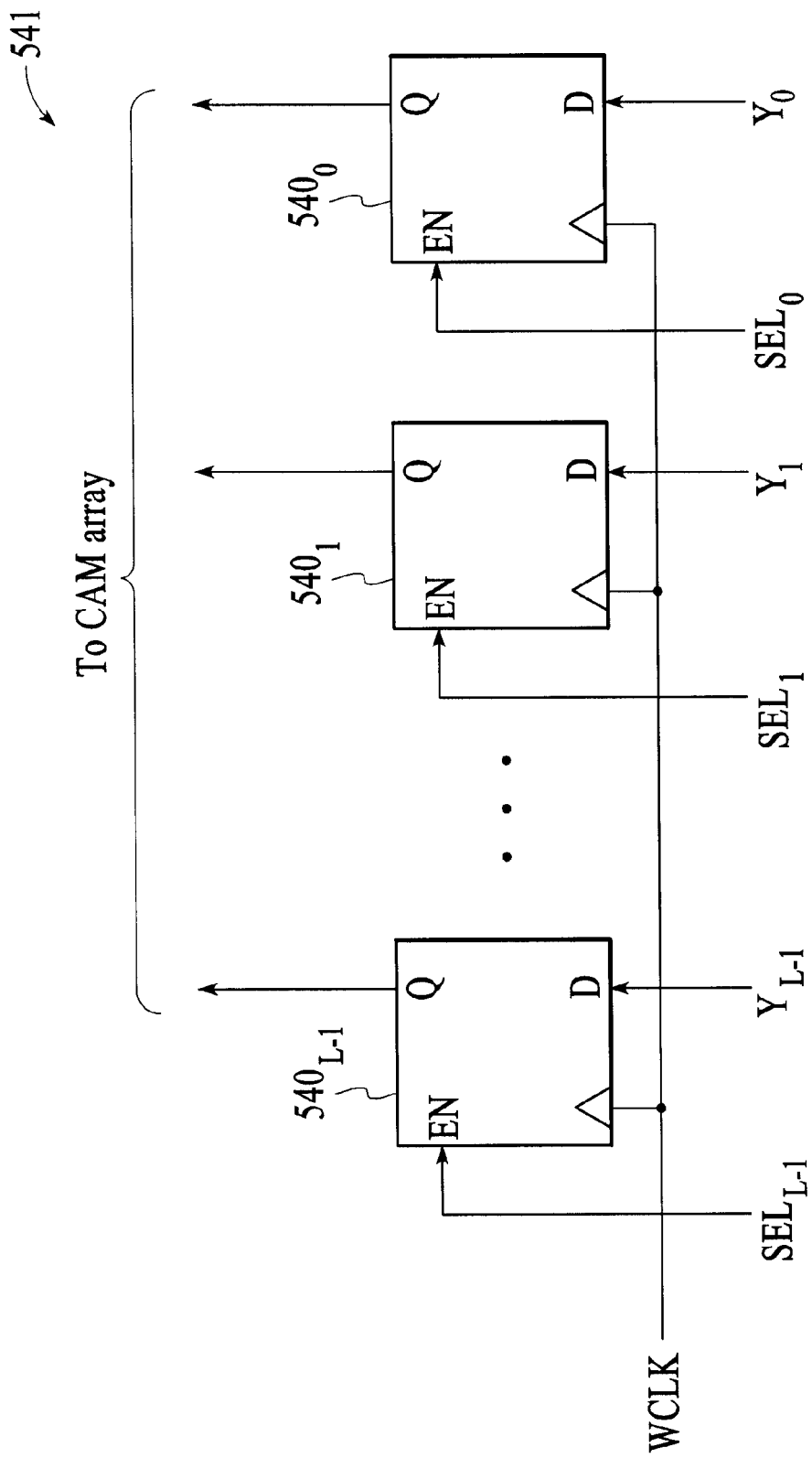
FIG. 8 illustrates one embodiment of a comparand register.

FIG. 8 illustrates comparand register 541 that is one embodiment of comparand register 504. Comparand register 541 includes as many register elements $540_0$–$540_{L-1}$ as output signals $Y_0$–$Y_{L-1}$ from switch circuitry 520. Each register element 540 receives a clock signal WCLK from a clock generator (not shown) in order to synchronize the loading of $Y_0$–$Y_{L-1}$ into the register elements. Each register element 540 also receives an segment enable signal SEL that indicates whether the particular register element is enabled to load the output data $Y_0$–$Y_{L-1}$.

Figure 9:
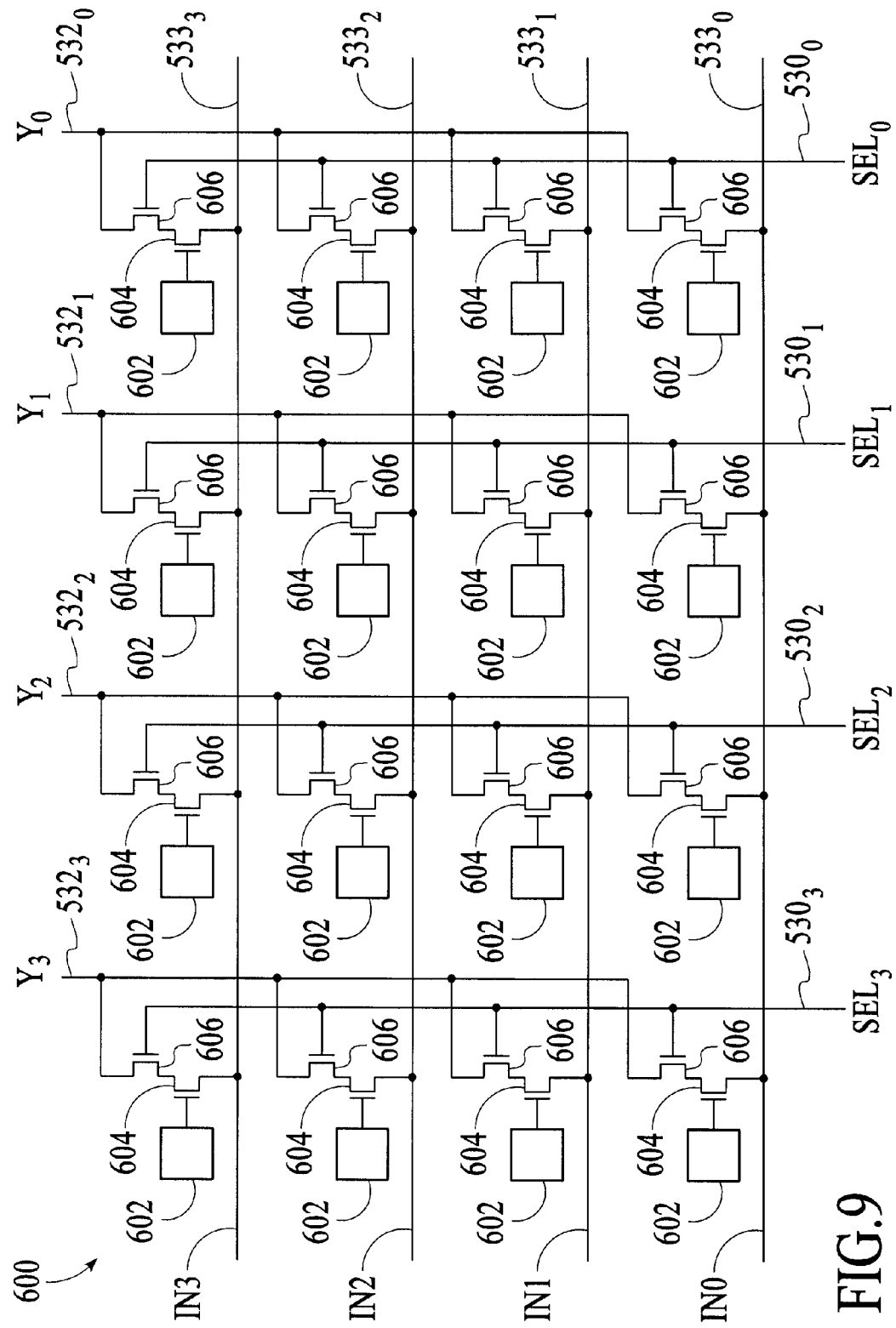
FIG. 9 illustrates one embodiment of a cross-bar switch.

FIG. 9 illustrates cross-bar switch (XBAR) 600 that is one embodiment of switch circuitry 520. XBAR 600 includes an array of four rows and four columns of memory storage elements 602 each coupled to a pair of transistors 604 and 606. Any array size may be used (e.g., 72 rows by 72 columns, 144 rows by 144 columns, 288 rows by 288 columns, etc.). Memory storage elements 602 and transistor pair 604/606 each make up a programmable switch element. Transistors 604 and 606 are coupled in series between an output signal line 532 and an input signal line 533. Each memory storage element 602 is coupled to the gate of a transistor 604. Additionally, the source of each transistor 604 is coupled to the drain of transistors 606. SEL signal lines 530 are each coupled to the gate of a column of corresponding transistors 606, and the drains of each column of transistors 606 are coupled to a corresponding output signal line 532.

Each memory storage element 602 and transistor pair 604/606 is positioned at the intersection of a row and column. In this example, input signals IN each represent one bit of input string 508 from FIG. 5, and output signals Y each represent one bit of a filtered comparand string provided to comparand register 504. Each memory storage element 602 can be programmed (e.g., by PDATA from program circuit 522 of FIG. 6) by one or more word lines and/or bit lines not shown so as not to obscure the figure. During a compare operation, if a memory storage element is programmed to output a corresponding input bit IN as an output signal Y (e.g., programmed as a logic high state to enable transistor 604 to conduct), then the connection will be established if the corresponding SEL signal is also in a high logic state. In this manner, only those connections associated with particular segments are enabled at any one time.

XBAR 600 is a full cross-bar switch that enables any input IN to be connected to any output Y. In an alternative embodiment, only a portion of XBAR 600 may be needed such as when an input string is compacted in only one direction. For example, when compacting the input string from higher bit positions to lower bit positions in the output string, the corresponding circuitry of the cross-bar switch for translating lower bit positions to higher bit positions may be removed from a full cross-bar switch. Similarly, when compacting the input string from lower bit positions to higher significant bit positions in the output string, the corresponding circuitry of the cross-bar switch for translating higher bit positions to lower significant bits positions may be removed from a full cross-bar switch.

Figure 10:
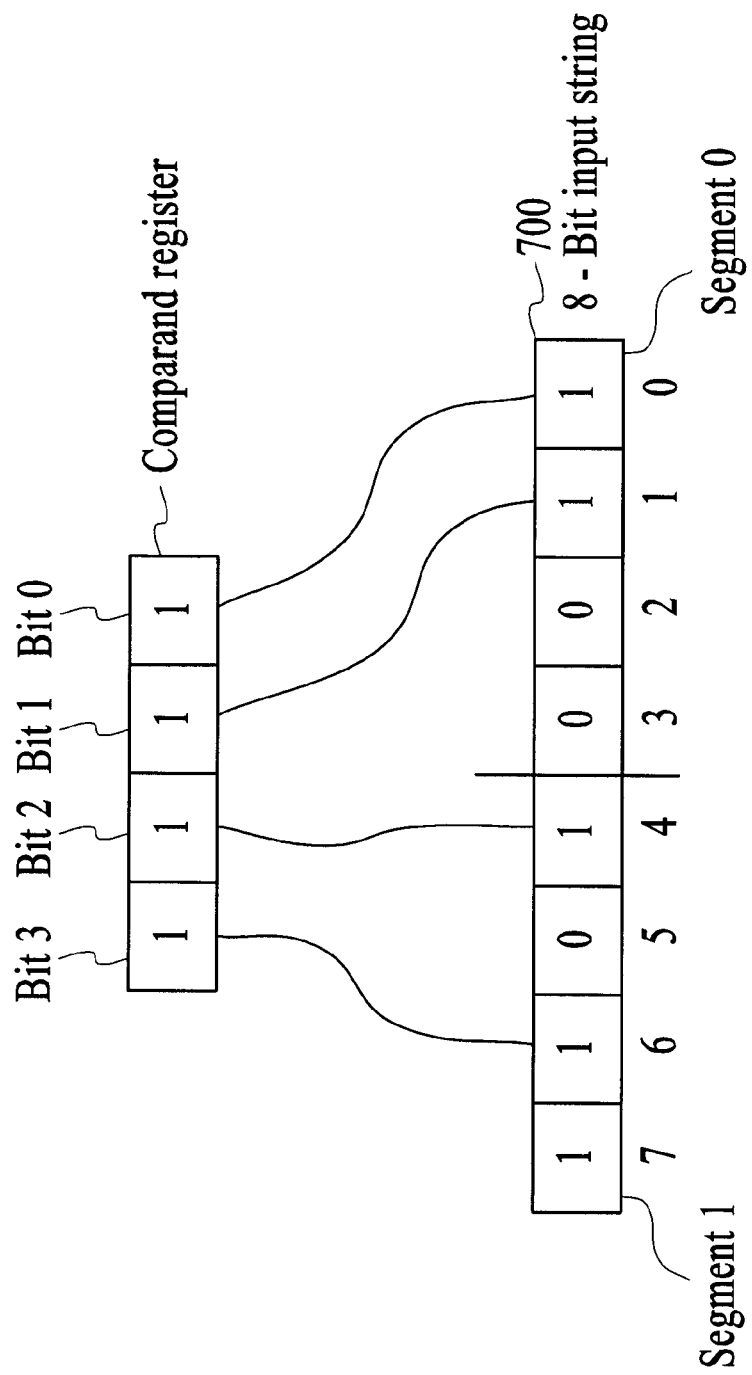
FIG. 10 illustrates one example of an input string filtered into a comparand register.
Figure 11:
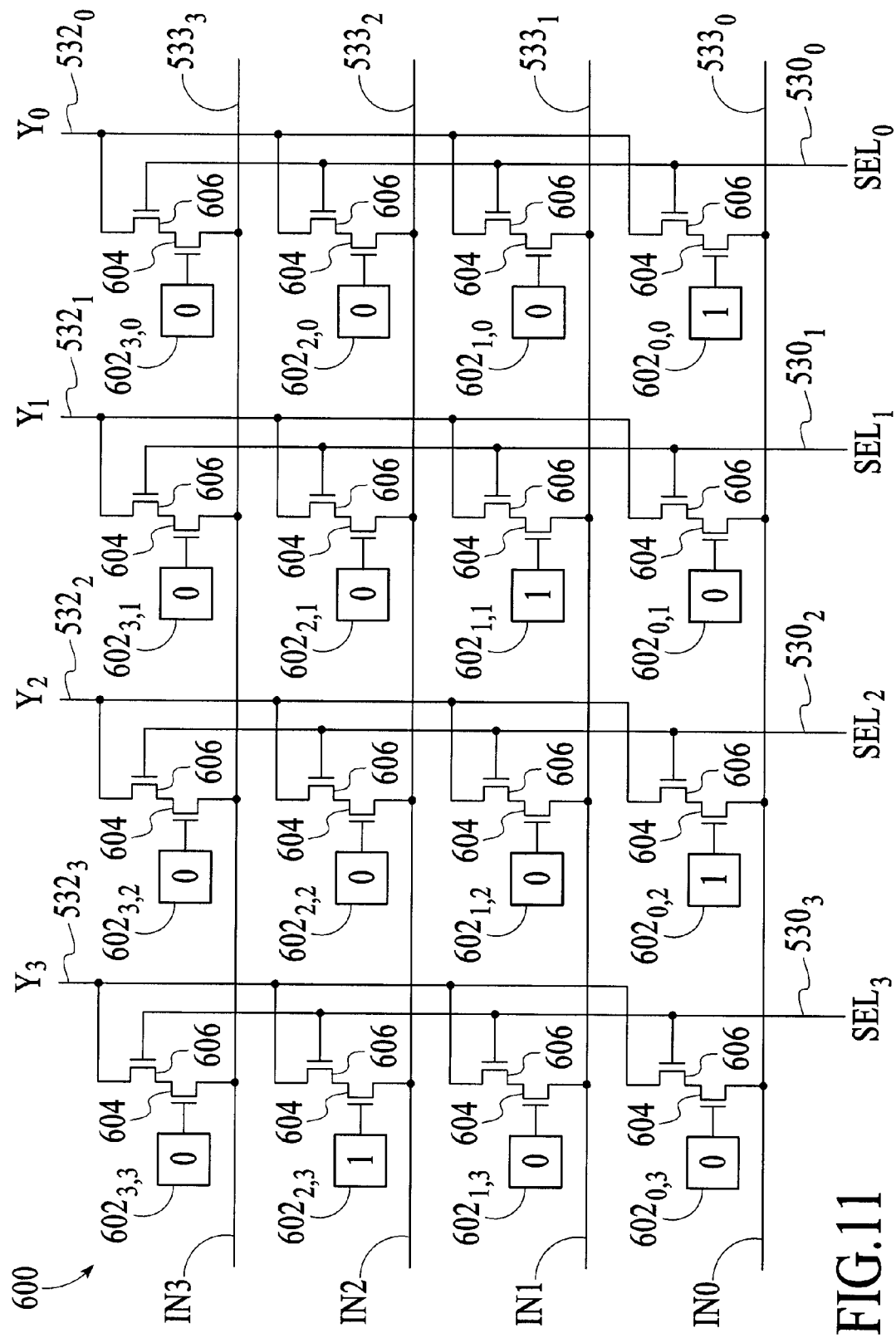
FIG. 11 illustrates one example of a programmed cross-bar switch.
Figure 12:
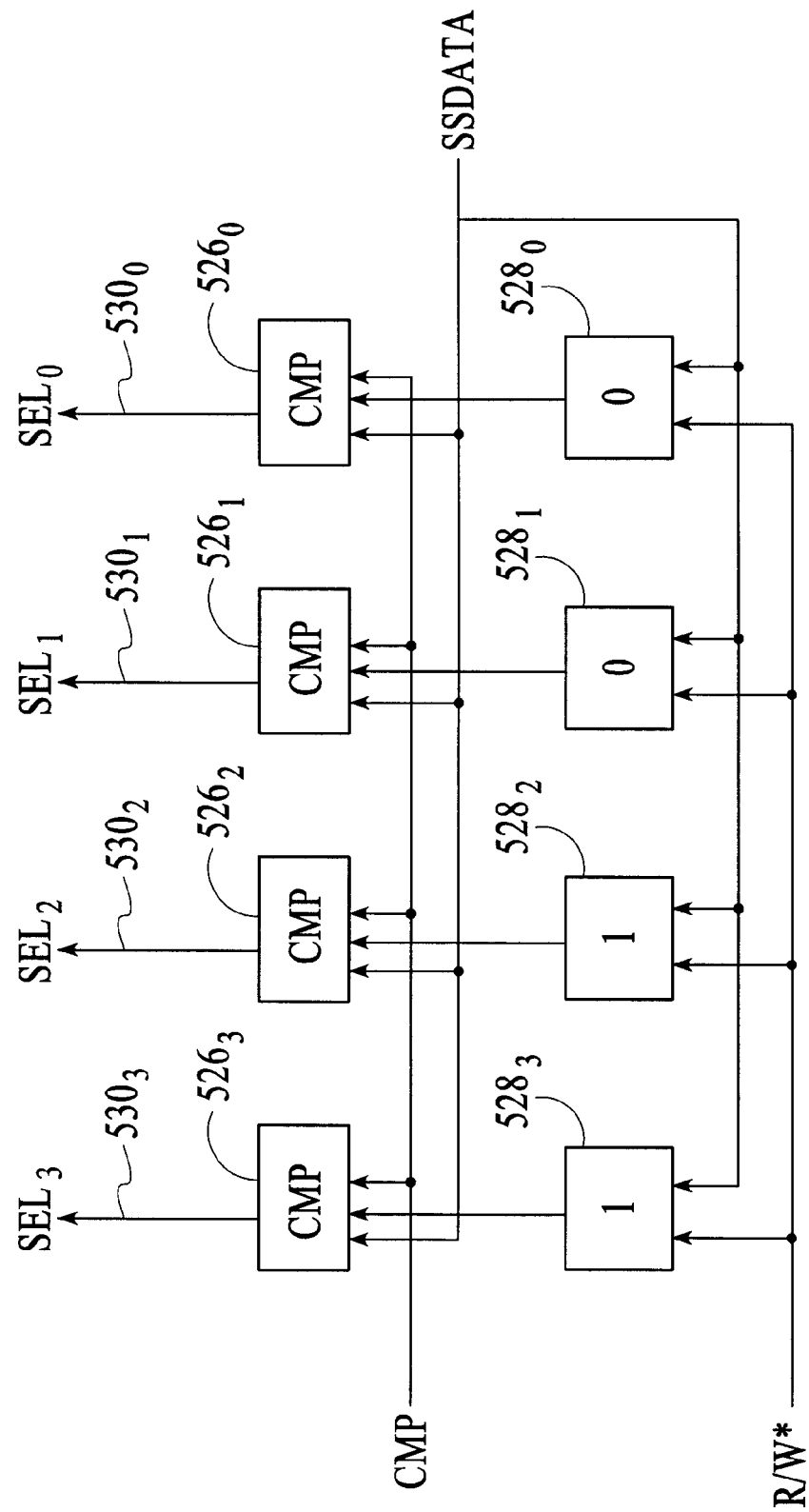
FIG. 12 illustrates one embodiment of programmed select logic.

FIG. 10 illustrates one example of an input string 700 that is filtered into a comparand register using, for example, the switch circuit of FIG. 9. Input string 700 is one embodiment of input string 508 of FIG. 5. Input string 700 has eight bits, bits 0–7 that are transmitted over the CBUS in two segments: segment 0 and segment 1. Segment 0 includes bits 0–3 and segment 1 includes bits 4–7. For this embodiment, the CBUS is L=4 bits wide; however, the CBUS could also be at least 8 bits wide. XBAR 600 can be programmed to perform the filter function on input string as shown in FIG. 11. Memory storage elements $602_{3,3}$–$602_{3,0}$ are programmed (e.g., by PDATA) as 0000, respectively; memory storage elements $602_{2,3}$–$602_{2,0}$ are programmed as 1000, respectively; memory storage elements $602_{1,3}$–$601_{1,0}$ are programmed as 0010, respectively; and, memory storage elements $602_{0,3}$–$602_{0,0}$ are programmed as 0101, respectively. Additionally, select logic 531 can be programmed to enable the appropriate SEL signals as shown in FIG. 12 in which memory circuits $528_3$ and $528_2$ store logic one states and memory circuits $528_1$ and $528_0$ store logic zero states.

During segment 0 (e.g., during a first clock cycle), input signal line $533_0$ carries bit 0 of input string 700 as IN0, input signal line $533_1$ carries bit 1 of input string 700 as IN1, input signal line $533_2$ carries bit 2 of input string 700 as IN2, and input signal line $533_3$ carries bit 3 of input string 700 as IN3. During this segment, SSDATA is equal to a logic zero state to indicate that segment 0 of input string 700 is present on the CBUS. SSDATA is compared with the stored states in memory circuits 528 and each of $SEL_1$ and $SEL_0$ are set to high logic states indicating matches with data stored in memory circuits $528_1$ and $528_0$, respectively, while $SEL_3$ and $SEL_2$ are set to logic zero states indicating mismatches with data stored in memory circuits $528_3$ and $528_2$, respectively. Since $SEL_1$ and $SEL_0$ are in logic one states and memory storage elements $602_{1,1}$ and $602_{0,0}$ are programmed with logic one states, the input bits 1 and 0 of segment 0 of input string 700 are coupled to $Y_1$ and $Y_0$, respectively, and are loaded into bits 1 and 0 of the comparand register. Since $SEL_3$ and $SEL_2$ are set to logic zero states, IN0 and IN3 are not transferred to Y2 and Y3, respectively, because transistors 606 are off, and the corresponding locations in the comparand register are not updated. In this manner, bits 1 and 0 of input string 700 are filtered from the input string and loaded into bit positions 1 and 0 of the comparand register.

During segment 1 (e.g., during a second clock cycle), input signal line $533_0$ carries bit 4 of input string 700 as IN0, input signal line $533_1$ carries bit 5 of input string 700 as IN1, input signal line $533_2$ carries bit 6 of input string 700 as IN2, and input signal line $533_3$ carries bit 7 of input string 700 as IN3. During this segment, SSDATA is equal to a logic one state to indicate that segment 1 of input string 700 is present on the CBUS. SSDATA is compared with the stored states in memory circuits 528 and each of $SEL_3$ and $SEL_2$ are set to high logic states indicating matches with data stored in memory circuits $528_3$ and $528_2$, respectively, while $SEL_1$ and $SEL_0$ are set to logic zero states indicating mismatches with data stored in memory circuits $528_1$ and $528_0$, respectively. Since $SEL_3$ and $SEL_2$ are in logic one states and memory storage elements $602_{2,3}$ and $602_{0,2}$ are programmed with logic one states, the input bits 6 and 4 of segment 1 of input string 700 are coupled to $Y_3$ and $Y_2$, respectively, and are loaded into bits 3 and 2 of the comparand register. Since $SEL_1$ and $SEL_0$ are set to logic zero states, IN1 and IN0 are not transferred to Y1 and Y0, respectively, because transistors 606 are off, and the corresponding locations in the comparand register are not updated. In this manner, bits 4 and 6 of input string 700 are filtered from the input string and compacted into bit positions 2 and 3 of the comparand register.

Figure 13:
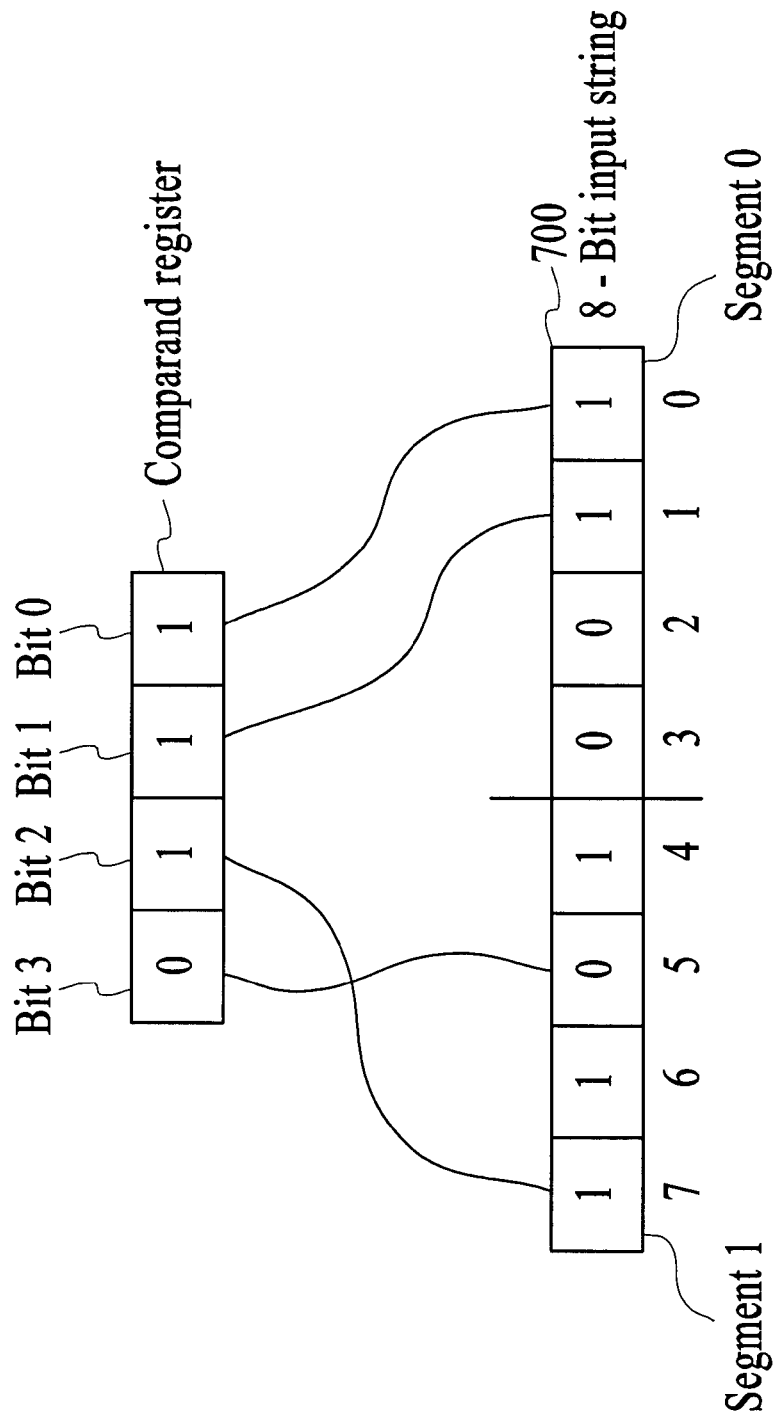
FIG. 13 illustrates one example of an input string filtered into a comparand register.
Figure 14:
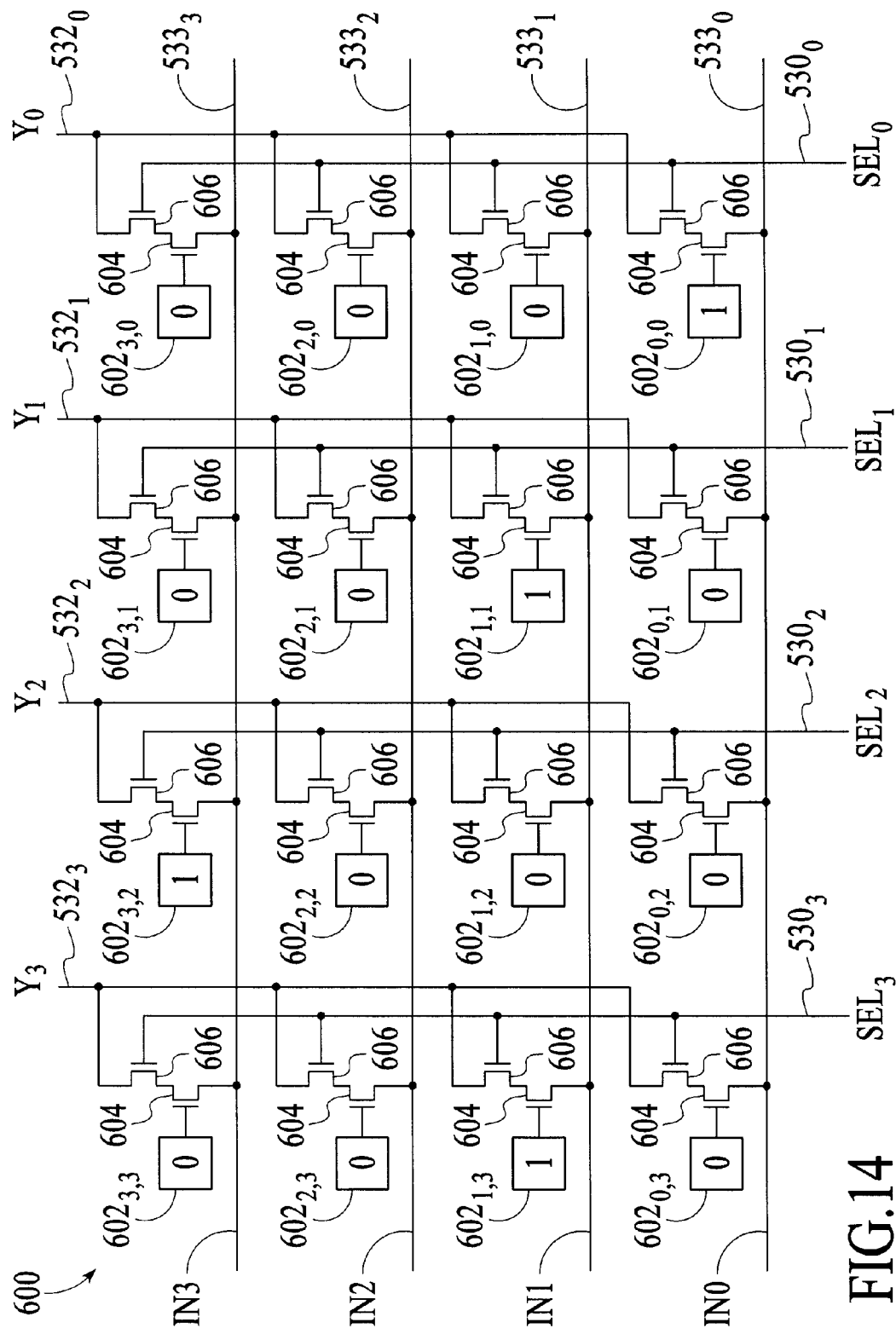
FIG. 14 illustrates one example of a programmed cross-bar switch.

Bits of the input string can also be transposed by XBAR 600 to different bit positions in the comparand register. For example, as shown in FIG. 13, bits 5 and 7 in segment 1 of input string 700 can be transposed to bits 2 and 3, respectively, of the comparand register. XBAR 600 can be programmed as in FIG. 14 such that memory storage elements $602_{3,3}$–$602_{3,0}$ are programmed as 0100, respectively; memory storage elements $602_{2,3}$–$602_{2,0}$ are programmed as 0000, respectively; memory storage elements $602_{1,3}$–$601_{1,0}$ are programmed as 1010, respectively; and, memory storage elements $602_{0,3}$–$602_{0,0}$ are programmed as 0001, respectively. During segment 1, $SEL_3$ and $SEL_2$ are in logic one states and input bits 7 and 5 of segment 1 (presented as IN3 and IN1, respectively) of input string 700 are coupled to $Y_2$ and $Y_3$, respectively, and are loaded into bits 2 and 3 of the comparand register. In this manner, bits 7 and 5 of input string 700 are filtered from the input string and compacted and transposed into bit positions 3 and 2 of the comparand register.

With reference again to select logic 531 of FIG. 7, the SSDATA indicates which segment of input data is present on the CBUS, and SSDATA is compared with data stored in each memory circuit 528 to determine which SEL signals are set to active high logic states. For the examples in FIG. 12, each memory circuit 528 only needed to store a single bit because there were only two segments of input data on the CBUS. When there are more than two segments of input data for a particular input data string on the CBUS, the memory circuits 528 each store a sufficient number of bits of information to identify which segment of the input data should set the corresponding SEL signal to a high state. For example, if there are four segments of the input data, each memory circuit may store four bits (one for each segment) or two encoded bits to represent the four segments. Such an example is shown as select logic 831 of FIG. 15.

Figure 15:
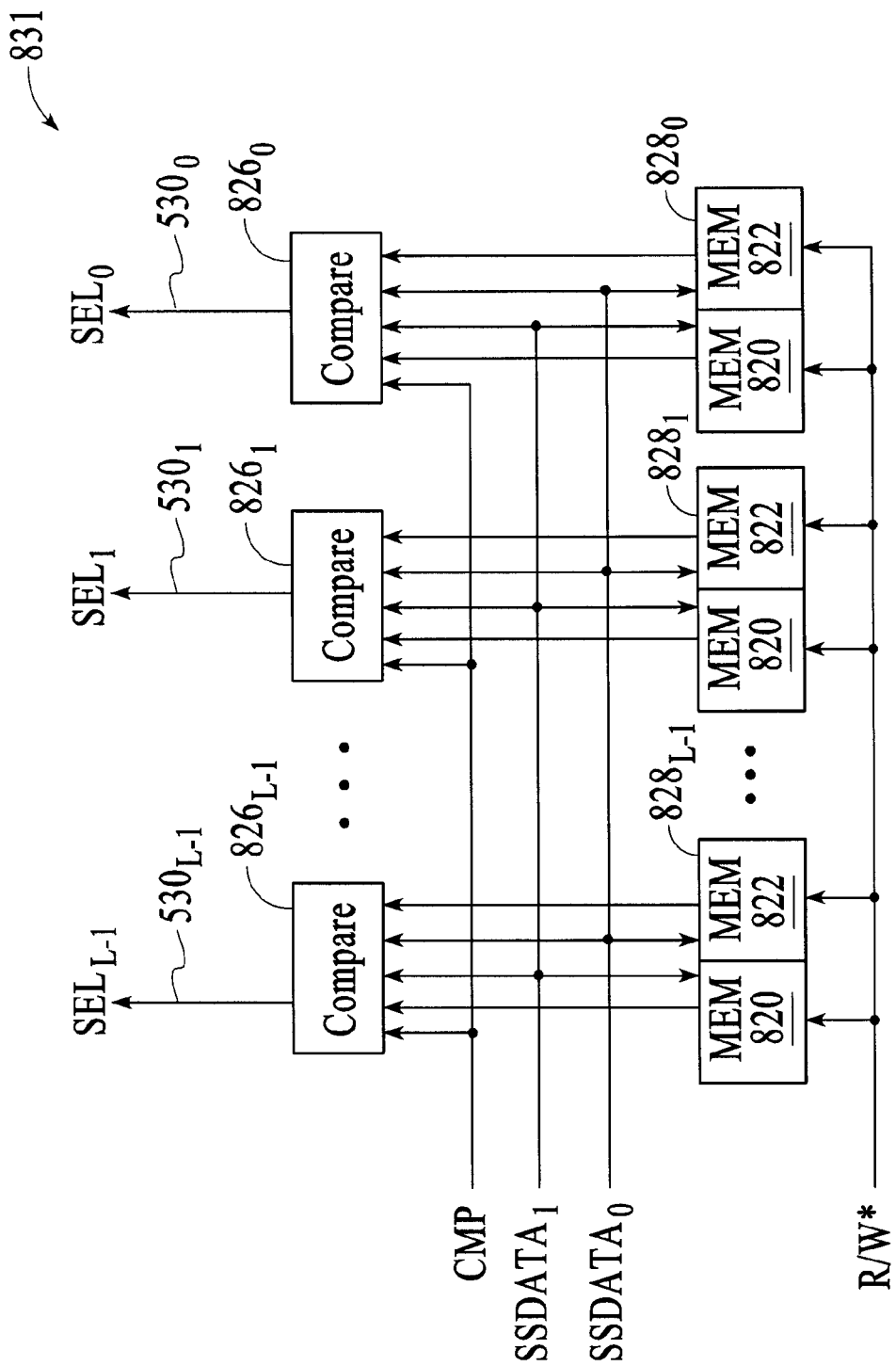
FIG. 15 illustrates another embodiment of the select logic of FIG. 5.

Select logic 831 of FIG. 15 includes L compare circuits $826_0$–$826_{L-1}$, each coupled to a corresponding memory circuit $828_0$–$828_{L-1}$ that each have a pair of memory storage elements 820 and 822. The memory storage elements each store one bit of SSDATA during a program or write operation (i.e., when R/W* is in a logic low state). One or more of the memory circuits 828 can be programmed with the same segment information representing up to four segments of the input data on the CBUS. For example, memory storage elements 820 are programmed by $SSDATA_1$ and memory storage elements 822 are programmed by $SSDATA_0$. Each of the compare circuits compares the contents of the corresponding memory storage elements with SSDATA during a compare operation (i.e., when CMP is in a high logic state). That is, $SSDATA_1$ is compared with contents stored in each of memory storage elements 820 and $SSDATA_0$ is compared with contents stored in each of memory storage elements 822. The comparison results are reflected on the SEL signal lines $530_0$–$530_{L-1}$.

In this example, SSDATA includes two bits such that up to four segments may be represented. The SSDATA signals may be generated, for example, by processor 310 of FIG. 3 or provided by instruction decoder 510 of FIG. 5 in response to a compare instruction for input data that is provided over multiple cycles. For example, if the compare instruction indicates that the input string has four segments, the SSDATA bits $SSDATA_1$ and $SSDATA_0$ may be logic states 00 to represent when the first segment of data is present on the CBUS, 01 to represent when the second segment of data is present on the CBUS, 10 to represent when the third segment of data is present on the CBUS, and 11 to represent when the fourth segment of data is present on the CBUS. For one embodiment a two-bit counter may be used to cycle through the four states in response to one or more control signals from the instruction decoder. Alternatively, a shift register may be used.

Figure 16:
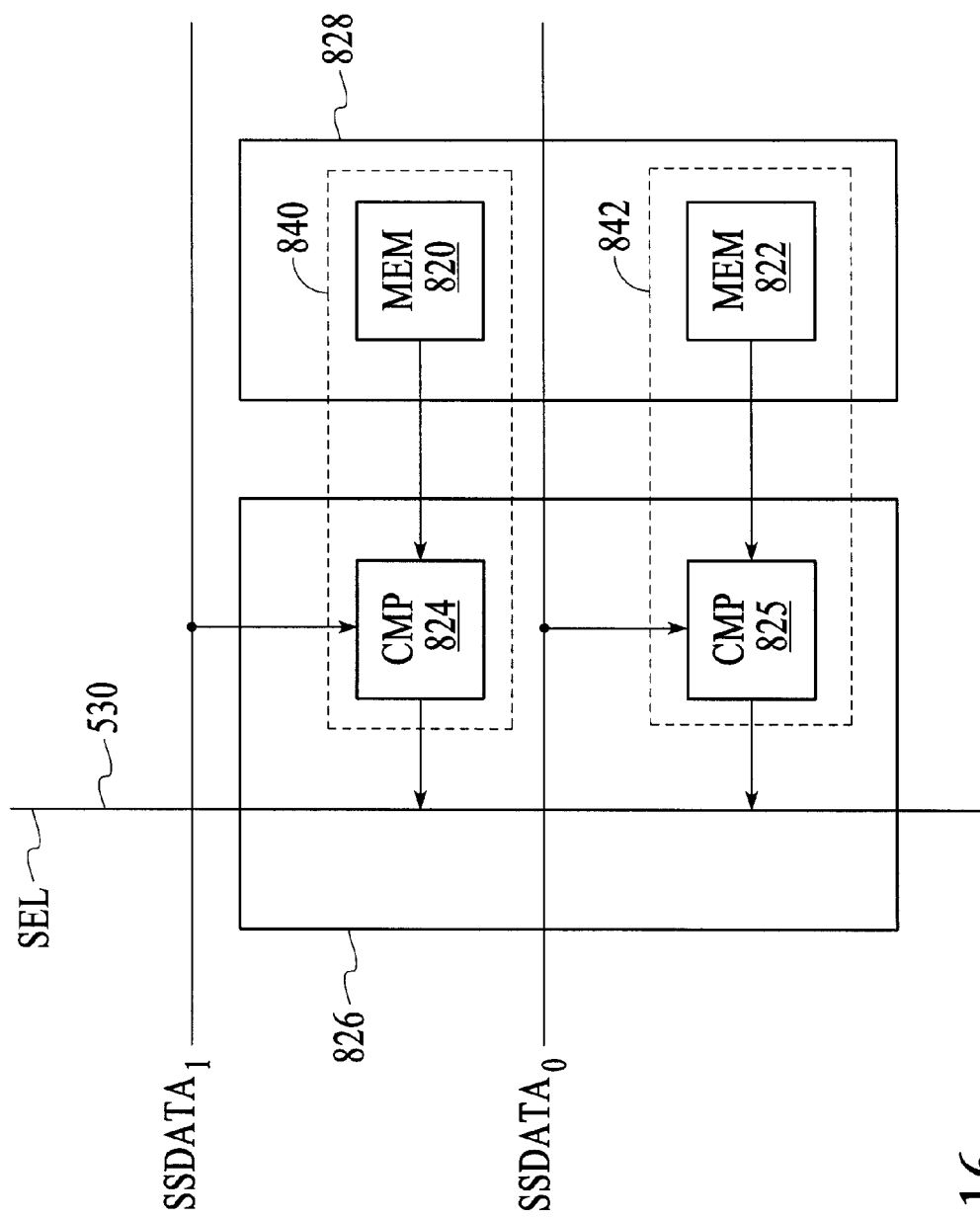
FIG. 16 illustrates one embodiment of a CAM cell pair for the select logic of FIG. 15.

As with select logic 531 of FIG. 7, each memory circuit/compare circuit pair (e.g., memory circuit 828 and compare circuit 826) may be formed as any type of CAM cells. For example, as shown in FIG. 16, each compare circuit 826/memory circuit 828 pair includes two CAM cells 840 and 842. For this embodiment, compare circuit 826 includes two compare circuits 824 and 825. CAM cell 840 includes memory storage element 820 and compare circuit 824. CAM cell 842 includes memory storage element 822 and compare circuit 825. Compare circuit 824 compares $SSDATA_1$ and the data stored in memory storage element 820 and provides the match result to the SEL signal line 530 which is a match signal line. Similarly, compare circuit 825 compares $SSDATA_0$ and the data stored in memory storage element 822 and provides the match result to the SEL signal line 530.

With reference again to FIG. 5, CAM array 502 may be a single CAM array that has Z rows of L CAM cells. The CAM array may be blocked out as X CAM array blocks each having R rows of L CAM cells, where Z equal R multiplied by X. In this embodiment, a first block has rows 0 to R−1, a second block has rows R to 2R−1, and so on, with the last (Xth) block having the last R rows. The CAM array can be blocked out to reduce the signal line length for bit lines, word lines and/or comparand lines in the arrays so as to reduce the impedance of the lines and increase the operating speed of the array as a whole. One embodiment of this arrangement is shown in FIG. 17.

Figure 17:
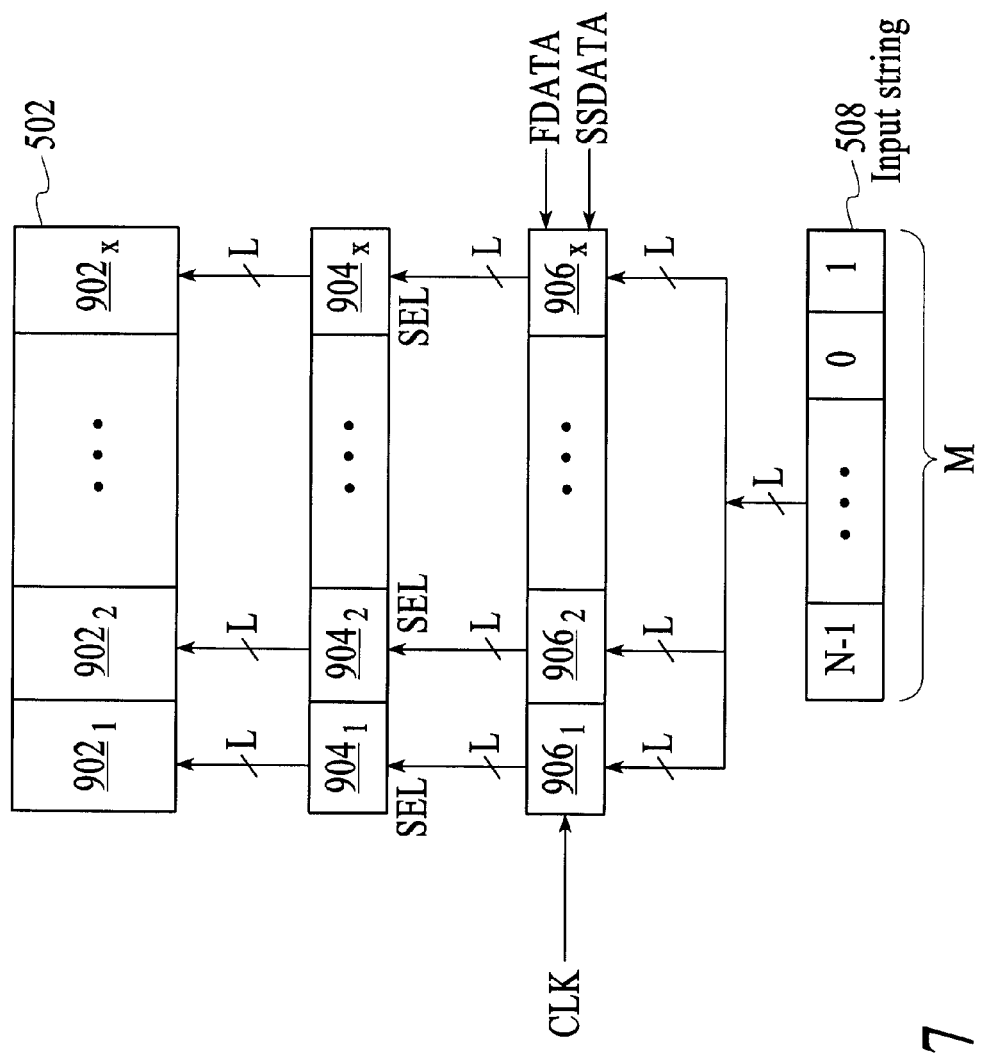
FIG. 17 illustrates another embodiment of a CAM device.

FIG. 17 shows that CAM array 502 blocked out into X CAM array blocks $902_1$–$902_X$ each having a corresponding comparand register $904_1$–$904_X$ and a filter circuit $906_1$–$906_X$. Each of the comparand registers 904 operate like comparand register 504 of FIG. 5, and each of the filter circuits 906 operate like the filter circuit 506 of FIG. 5. Each of the filter circuits 906 receives FDATA and SSDATA and segments from the input string 508 such that each of the filter circuits is able to filter the input string for a corresponding comparand register. For this embodiment, each filter circuit 906 outputs the same signals to each of the corresponding comparand registers 904. Alternatively, one or more of the filter circuits is programmed differently than the other filter circuits to output different signals to the corresponding comparand register.

Each of the filter circuit 906 may operate concurrently (e.g., overlapping at least at one point in time) to simultaneously perform the filtering function and further increase overall throughput and performance of the device. Alternatively, one or more of the filter circuits 906 may perform its filtering of the input string before or after one of the other filter circuits 906.

As indicated above, each of the filter circuits 906 operate like the filter circuit 506 of FIG. 5 and may include one of the various embodiments of the filter circuits described above. For one embodiment, each of the filter circuits 906 includes switch circuitry 520, select logic 524 and program circuit 522 as shown in FIG. 6.

For an alternative embodiment, each of the CAM array blocks 902 may be a segment of a single CAM array 502 (or of a single CAM array block of a blocked out CAM array) having X segments each having Z rows of L CAM cells, where CAM array 502 has a total of Z rows of CAM cells.

For another embodiment, one or more of the filter circuits 906 shares the select logic 524 and/or the program circuit 522 from another one of the filter circuits. For other embodiments, a single filter circuit 906 and/or comparand register 904 may be shared by more than one block or segment 902, for example, by routing the output signal lines from each comparand register to more than one block or segment 902. For still other embodiments, the program circuit 522 is not used.

In the foregoing specification, the invention is described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) apparatus comprising:
   an array of CAM cells to store data to be compared with a comparand value;
   a select circuit to store a plurality of segment-select values, each segment-select value indicating which of a plurality of segments of input data is to source a respective bit of the comparand value;
   a program circuit to store filter data that indicates, within each of the plurality of segments indicated by the segment select values, selected bits, if any, to be included within the comparand value; and
   switch circuitry to output, as the comparand value, the selected bits of each of the plurality of segments of input data according to control signals received from the program circuit and from the select circuit.

2. The CAM apparatus of claim 1 wherein the select circuit comprises:
   a plurality of memory storage circuits to store the plurality of segment-select values; and
   a plurality of compare circuits to compare the plurality of segment-select values with input segment information to generate a plurality of select signals.

3. The CAM apparatus of claim 2 wherein the plurality of compare circuits and the plurality of memory storage circuits form a plurality of CAM cells.

4. The CAM apparatus of claim 2 wherein the switch circuitry comprises L rows of programmable switch circuits coupled to receive L input bits of the input data and coupled to receive the select signals from the select circuit.

5. The CAM apparatus of claim 4 wherein the L inputs bits are one of N segments of M input bits where M is equal to N multiplied by L.

6. The CAM apparatus of claim 1 wherein the switch circuitry comprises a plurality of programmable switch elements, and wherein the CAM apparatus further comprises a program circuit coupled to the switch circuitry to program the plurality of programmable switch elements.

7. The CAM apparatus of claim 1 wherein the switch circuitry comprises a cross-bar switch.

8. The CAM apparatus of claim 1 further comprising a comparand register coupled between the switch circuitry and the array of CAM cells, the comparand register to store the comparand value output from the switch circuitry.

9. The CAM apparatus of claim 8 further comprising a global mask register coupled between the comparand storage register and the array of CAM cells.

10. The CAM apparatus of claim 1 wherein at least one bit of the input data has a first bit position in the input data and a second, different bit position in the comparand value.

11. The (CAM) apparatus of claim 1 wherein the array of CAM cells comprises a plurality of CAM array blocks each having a plurality of rows of CAM cells.

12. The CAM device of claim 11 wherein the switch circuitry is coupled to provide the comparand value to each of the plurality of CAM array blocks.

13. The CAM apparatus of claim 11 wherein the select circuit and the switch circuitry correspond to a first CAM array block of the plurality of CAM array blocks, and wherein the CAM apparatus further comprises at least one additional select circuit and at least one additional switch circuitry that correspond to a second CAM array block of the plurality of CAM array blocks.

14. The CAM apparatus of claim 1 wherein the array of CAM cells are disposed in rows and columns, with the rows being segmented to form a plurality of columns of row segments, each row segment including a plurality of CAM cells.

15. The CAM apparatus of claim 14 wherein the select circuit and the switch circuitry correspond to a first column of the plurality of columns of row segments, and wherein the CAM apparatus further comprises at least one additional select circuit and at least one additional switch circuitry that correspond to a second column of the plurality of columns of row segments.

16. The CAM apparatus of claim 14, wherein the number of CAM cells included in each row segment matches a width of the comparand value, and wherein the switch circuitry is coupled to provide the comparand value to each of the plurality of columns of row segments.

17. A content addressable memory (CAM) apparatus comprising:
   an array of CAM cells to store data to be compared with a comparand value;
   means for storing a plurality of segment-select values, each segment-select value indicating which of a plurality of segments of input data is to source a respective bit of the comparand value;
   means for storing filter data that indicates, within each of the plurality of segments indicated by the segment select values, selected bits, if any, to be included within the comparand value; and
   means for outputting, as the comparand value, one or more bits of each of the plurality of segments of input data indicated by the select circuit to be a source of a bit of the comparand value, according to control signals received from the means for storing a plurality of segment select values and from the means for storing filter data.

18. The CAM apparatus of claim 17, wherein the means for outputting comprises a cross-bar switch.

19. A method of operation within a content addressable memory device, the method comprising:
storing a plurality of segment-select values, each segment-select value indicating which of a plurality of segments of input data is to source a respective bit of a comparand value;
storing filter data for indicating, within each of the plurality of segments indicated by the segment select values, selected bits, if any, to be included within the comparand value;
outputting, as a comparand value, one or more bits of each of the plurality of segments of input data indicated by a combination of the segment-select values and the filter data to be a source of a bit of the comparand value; and
comparing the comparand value to contents of an array of CAM cells.

20. A method comprising:
receiving a plurality of segments of input data in a content addressable memory (CAM) apparatus having an array of CAM cells;
storing a plurality of segment-select values within the CAM apparatus, each segment-select value indicating which of the plurality of segments of input data is to source a respective bit of the comparand value;
storing filter data that indicates, within each of the plurality of segments indicated by the segment select values, selected bits, if any, to be included within the comparand value; and
selectively enabling, in response to the plurality of segment-select values, and in response to the filter data, programmed switch circuitry to filter at least one bit of the input data to generate at least one comparand bit for the array of CAM cells.

21. The method of claim 20 wherein selectively enabling programmed switch circuitry to filter at least one bit of the input data comprises selectively enabling at least one programmed switch circuit to couple one bit of the input data to at least one bit position of a comparand storage element.

22. The method of claim 20 further comprising comparing the comparand bit with data stored in the array of CAM cells.

23. The content addressable memory of claim 1 wherein the switch circuit comprises a cross-bar switch having a plurality of switching junctions, wherein each switching junction comprises at least first and second transistors disposed in series, wherein the first transistor is configured to be gated by a bit-value stored within the filter circuit, and the second transistor is configured to be gated by a signal produced by the select circuit.

* * * * *